United States Patent
Fujikawa et al.

[11] Patent Number: 5,635,764
[45] Date of Patent: Jun. 3, 1997

[54] SURFACE TREATED STRUCTURE FOR SOLDER JOINT

[75] Inventors: Hisayoshi Fujikawa, Seto; Takeshi Ohwaki; Yasunori Taga, both of Nagoya; Osamu Takenaka, Kariya; Kenji Kondo, Hoi-gun; Takao Yoneyama, Anpachi-gun; Ichiharu Kondo, Nagoya, all of Japan

[73] Assignee: Nippondenso Co., Ltd., Kariya, Japan

[21] Appl. No.: 284,684

[22] PCT Filed: Dec. 9, 1993

[86] PCT No.: PCT/JP93/01788
§ 371 Date: Aug. 9, 1994
§ 102(e) Date: Aug. 9, 1994

[87] PCT Pub. No.: WO94/14190
PCT Pub. Date: Jun. 23, 1994

[30] Foreign Application Priority Data
Dec. 10, 1992 [JP] Japan .................. 4-330343

[51] Int. Cl.$^6$ .................................... H01L 23/48
[52] U.S. Cl. ................ 257/766; 257/772; 257/779
[58] Field of Search ........................ 257/772, 779, 257/750, 766

[56] References Cited

U.S. PATENT DOCUMENTS

| 3,566,209 | 2/1971 | Shaw ........................ 257/727 |
| 4,394,673 | 7/1983 | Thompson et al. . |
| 4,480,261 | 10/1984 | Hattori et al. . |
| 4,847,675 | 7/1989 | Eng . |
| 4,965,656 | 10/1990 | Koubuchi et al. . |
| 5,239,447 | 8/1993 | Cotues et al. ............. 257/686 |
| 5,306,950 | 4/1994 | Fuyikawa et al. ........ 257/741 |

FOREIGN PATENT DOCUMENTS

| 50-65591 | 5/1975 | Japan . |
| 57-63855 | 4/1982 | Japan . |
| 63-60537 | 3/1988 | Japan . |
| 2256249 | 10/1990 | Japan . |
| 3218950 | 9/1991 | Japan . |
| 3229422 | 10/1991 | Japan . |
| 4211153 | 8/1992 | Japan . |

OTHER PUBLICATIONS

"The Formation of Silicides From Thin Films of Some Rare–Earth Metals" J.E. Baglin F.M. D'Heurle, and C.S. Petersson, pp. 594–596.

"Low Schottky Barrier of Rare–Earth Silicide on n–SI" K.N. Tu, R.D. Thompson, and B.Y. Tsaur, Jan. 13, 1981 pp. 626–628.

*Primary Examiner*—Sara W. Crane
*Assistant Examiner*—Roy Potter
*Attorney, Agent, or Firm*—Cushman, Darby & Cushman IP Group of Pillsbury Madison & Sutro LLP

[57] ABSTRACT

On a rear surface of a semiconductor (10), a contact layer (11), a diffusion preventing layer (12) and a solder joint layer (13) are formed, and this solder joint layer (13) is connected to a mount base (15) by a Pb-Sn solder layer (14). The contact layer (11) is formed of a rare earth metal, its silicide or a composite thereof, the diffusion preventing layer (12) is formed of a ferrous metal, and the solder joint layer (13) is formed of a Ni-Au alloy. By forming the diffusion preventing layer (12) using the ferrous metal, a diffusion of tin in a solder is prevented and by the solder joint layer (13) of the Ni-Au alloy, an excellent solder joint property can be maintained to reduce the number of laminated layers. Further, as a surface treated layer of at least one joint member, the Ni-Au alloy is used and by heating the semiconductor substrate via a solder foil in a reducing atmosphere a high airtightness is obtained.

19 Claims, 4 Drawing Sheets

SURFACE TREATED STRUCTURE FOR SOLDER JOINT

TECHNICAL FIELD:

The present invention relates to a solder joint of a case with a substrate or ground metal having an inferior solder wettability.

For instance, the present invention relates to (A): a semiconductor electrode structure for connecting a semiconductor substrate to a mount base by a Pb-Sn (lead-tin) solder and (B): a no-flux soldering method for connecting a small solder joint part of a pressure sensor unit or the like requiring high airtightness to a metallic part without using flux to attain excellent joint quality.

BACKGROUND ART:

Conventionally, as a surface treatment for improving solder wettability of a solder joint part, a Ni/Au (nickel/gold) laminated thin film structure is used. However, there are problems such as (1): requiring two stages of film forming steps and (2): the solder wettability is unequivocally decided depending on an Au film thickness and thus cannot be freely controlled.

Further, in the case of the semiconductor electrode structure or the pressure sensor unit, the respective technical backgrounds are as follows:

(A): In the case of the semiconductor electrode structure, a very important factor for various semiconductor devices is how to electrically connect with an external member. In particular, owing to an inferior operational environment very hard conditions are imposed on semiconductor devices of electrical components of automobiles and the like, which are different from OA (office automation) equipment components.

The requirements for the electrodes of such semiconductor devices are as follows:

1) In order to prevent the performance degradation of the semiconductor devices, a contact resistance between the semiconductor and the electrode should be small, particularly, the contact resistance should be sufficiently small at low temperature operation.

2) In connecting a semiconductor chip with lead wires and a mount base, an impurity causing a malfunction or an unstable operation of an electronic device should not diffuse into the electrode.

3) The electrode should be connectable to the lead wires and the mount base with good stability and reproducibility and the connection should have a large adhesive strength, and excellent heat resistant and corrosion resistant properties over a long period of operation.

Hitherto, as a structure for carrying out an electrical connection of such a semiconductor device, a semiconductor substrate is connected to a mount base using solder to carry out an electrical connection with an external member. In this case, first a Cr (chromium) or Ti (titanium) layer is formed on the rear surface of the semiconductor substrate and an Ni layer and an Au layer are successively formed on the Cr or Ti layer. These electrode layers are coupled with the mount base via a solder layer. In this instance, the Cr or Ti layer acts as a contact layer with the semiconductor to form an ohmic electrode along with the semiconductor of the electrode layers, with the result of a reduction in the contact resistance. The Ni/Au layers improve the solder wettability not only to ensure the soldering capability but also to play a role of a diffusion preventing layer for preventing the tin within the solder from diffusing into the semiconductor substrate side. With this structure, while the electrical connection can be sufficiently kept, the diffusing of the impurity (the tin within the solder) into the semiconductor substrate can be prevented.

On the other hand, with the progress of the recent semiconductor technique, in order to accomplish a higher accurate operation, an electrode having a low contact resistance and an excellent ohmic property in a substrate having a low dopant concentration, that is, a high resistivity in a semiconductor has been desired. In the above-described electrode structure, the use of the material Cr or Ti permits an increase of a contact resistivity against Si (silicon), and no ohmic electrode having a sufficiently low electric resistance can be formed, and hence an unstable operation in the semiconductor device is caused. In particular, in the electric components for the automobiles, when they are used at a low temperature, the contact resistance at the interface between the semiconductor and the electrode turns out to be large and no ohmic electrode having a sufficiently low resistance can be formed.

Moreover, because of the recent progress in the field of electronics, a higher precision operation has been required with respect to semiconductor devices. Further, Si semiconductors have come to be used in a hot and humid environment like an automobile and for a large power and heavy current control which it was not possible to do before. Such semiconductor devices must withstand the use at a high temperature due to the high temperature of the operational environment and Joule heat generated by heavy current, and stability at a high temperature with respect to a connection of a semiconductor chip with a radiation mount base in comparison with generally used devices. However, in the aforementioned electrode structure, owing to the diffusion of the tin within the solder at the high temperature operation, the contact resistance between the semiconductor and the electrode turns out to be large or an exfoliation or corrosion occurs at the solder joint part between the mount base and the semiconductor.

On the other hand, it is well-known that the materials having a low height electric barrier (Schottky barrier) at an interface between a semiconductor and a metal, such as rare earth metals or silicides of the rare earth metals have a smaller contact resistance than that of Cr or Ti (see Applied Physics Letters 36,594 (1980), Applied Physics Letters 38(8),626 (1981) and the like). However, since these metals and their silicides are very oxidizable materials, they cannot be used for usual electrode structures. Further, it can be considered that as a diffusion preventing layer for preventing the tin within the solder from diffusing into the semiconductor side and an oxidation preventing layer of the rare earth metals, a TiW or W (tungsten) layer can be used, but this electrode has a bad solder wettability and thus could not be used for a solder joint electrode.

Also, from a conventional electrode structure of Cr/Ni/Au an electrode structure of a rare earth metal/Ni/Au can be readily conceivable. However, in this structure, although the junction property with the solder and the prevention of the tin diffusion are effected by the Ni/Au layers, Ni itself can diffuse into the rare earth metal and the solder at a solder joint temperature of approximately 250 degree (C.) to react with the semiconductor, which is disadvantageous, and the contact resistance is increased by the solder joint. As a result, this cannot be applied as an electrode structure of a practical technique. That is a diffusion preventing layer of the tin within the solder which cannot react with the rare earth metal and can connect with the solder cannot be obtained and hence an electrode structure using a rare earth metal having excellent electrical properties has not been realized.

On the other hand, it is already known that an Fe (iron) film as a material capable of preventing the tin within the solder from diffusing and connecting with the solder can be used for a solder joint layer (see Japanese Patent Laid-Open No. Sho 63-60537). In an electrode using an Fe film, the Fe film effectively prevents the diffusion of the tin within the solder and a stable solder joint strength can be obtained. However, when this Fe film is used for the electrode of the semiconductor, there is the drawback that the contact resistance with respect to the semiconductor cannot be sufficiently lowered and a junction with sufficiently low contact resistance cannot be made to the Si substrate having a required high resistivity.

Further, in the case where an Fe film or Fe/Au layers are used as the solder joint layer and are connected to the solder at a high temperature, on account of a bad wettability of the solder on the Fe film, poor soldering is caused. A junction using a high temperature solder is a necessary and indispensable step to an electrical connection of a semiconductor device for controlling heavy current and unavailability of this method brings about a large obstruction to the use of the Fe film.

It is also known that as measures to solve these problems, an alloy of Ni or Fe and a metallic element of Au, Ag, Mo or W added thereto improves not only the soldering property but also the junction strength and the corrosion resistant property (see Japanese Patent Laid-Open No. Hei 4-211153 and Japanese Patent Laid-Open No. Hei 3-229422). However, the contact resistance of the interface between the metal including Ni or Fe and the semiconductor is large and the use of these metals as the electrode for the solder joint against the semiconductor is impractical. In addition, it is not known for the addition of Au to Ni to lead to more than the solder wettability of the Ni/Au laminated layer structure.

(B): Next, In the case of the solder joint part of the pressure sensor unit, for example, a joint part size is very small such as approximately 0.5 mm and a high airtightness such as a leak amount of less than $1 \times 10^{-11}$ atm·cc/s is required. Hence, conventionally, in order to improve the solder wettability, flux is applied to a joint surface to carry out soldering.

However, when heating using the flux, a gas is generated from the flux, and the generated gas remains in the form of a void in the soldering part, and this void happens to be a main cause of defective airtightness in the joint part. Hence, in the case where the joint part is a fine size, it is very difficult to improve the airtightness at the joint part.

In addition, in this case, the flux residue is required to be washed out after the soldering and thus the number of soldering steps increases. Also, a Freon solvent is used as a detergent and the use of flux is not preferable from a viewpoint of protection of the environment.

Accordingly, as a no-flux soldering method, by using a solder spreading effect due to the load and the solder's own weight, a method for improving a solder wettability balance of joint surfaces of joint members arranged one on top of on another is proposed, as disclosed in Japanese Patent Laid-Open No. Hei 3-218950. However, in this method, when a glass pedestal and a metallic stem are jointed together in a pressure sensor having a sensor chip integrated with a high integrated semiconductor circuit, the surface of the sensor chip is contacted with a jig in a fabrication process and a fine flaw is made on the surface of the sensor chip, which causes defective electrical properties.

Further, when the surface states of the joint members to be coupled are different, the solder wettability balance of the upper and lower surfaces is destroyed and a defective solder wettabllity occurs.

The present invention has been accomplished in view of the above-described problems of the prior art. That is, an object of the present invention is to provide a surface treated structure which prevents tin within a solder from diffusing and has an excellent solder joint property and which is capable of controlling solder wettability and has a small number of laminated layers, and to provide a no-flux soldering method using this surface treated structure.

(A): In the case of a semiconductor electrode structure, specific points to be observed one, that first of all, with respect to a semiconductor substrate and while oxidation of rare earth metals having a low contact resistance or silicides thereof is prevented, how to maintain the low contact resistance has been energetically investigated. That is, the rare earth metals and the silicides thereof have a lower Schottky barrier height in comparison with Cr and Ti and measures have been investigated so as to make use of an ideal laboratory level results that show that the contact resistance can be reduced by a factor of ten. The rare earth metals and the silicides thereof which are left untouched tend to be oxidized and to react with a metal such as Ni and Cu (copper) which can be soldered at a low temperature. Hence, first, a diffusion preventing layer capable of being soldered is to be formed on a rare earth metal or a silicide thereof.

Hence, as the diffusion preventing layer to be combined with a contact layer composed of a rare earth metal layer, its silicide layer or a composite thereof, it has been considered to use a metal satisfying the following conditions:

1) A metal having a strong bond strength with respect to the rare earth metals and the silicides thereof and which has difficulty in mutually diffusing thereinto.

2) A metal capable of being soldered and preventing the tin within the solder from diffusing.

As a result of systematic experiments, iron or a metal containing iron has been found. That is, the ferrous metal can prevent the diffusion or the tin and, when the ferrous metal is combined with the rare earth metal layer or its silicide layer, the iron itself does not diffuse into the semiconductor side even at a temperature of 450° C. more than the joint temperature of the hot solder so as to allow the contact resistance to be kept low.

However, although an Fe film is a solder wettable material, oxidation of the Fe film should be prevented. Hence, conventionally, an Au film has been formed on the Fe film in order to prevent the oxidization of the Fe surface but in this case, the solder does not spread well in comparison with the Ni/Au film heretofore used. In particular, in a hot soldering joint operation within a hydrogen reducing furnace or an inert gas, defective soldering occurs and thus it is difficult to fabricate the device.

Then, while the stability of a junction between the rare earth metal having a low contact resistivity or its silicide and the Fe film, and the diffusion preventing effect of the tin within the solder are maintained, further, in order to prepare a laminated electrode which can be readily soldered, the use of an alloy film having an excellent solder wettability as a solder joint film to be formed on the Fe film has been considered. By using such an alloy film, 1) the solder wettability of the Fe film can be improved and 2) the production process can be simplified without increasing the number of laminated layers.

(B): Further, in the case of the pressure sensor unit, the object is to provide a no-flux soldering method. That is, even when a glass pedestal of a pressure sensor with a sensor chip including a built-in high integrated semiconductor circuit is connected with a metallic stem, no flaw is made on the surface of the sensor chip, and by optimizing the compositions of the surface treated layers of the joint surfaces to be coupled, the solder wettability balance of the two soldering joint surfaces can be maintained at a normal state.

According to the present invention, as a surface treated layer of the solder joint part, an Ni-Au alloy has been found by systematic investigation. In addition, it has been found that in a specified composition area, this alloy has a particular alloy structure and excellent characteristics such as stability in air, stability during a heat treatment (less than 400° C.) and the like. That is, in the present invention, compared with the case where the known materials Au and Ag (silver) are used, excellent soldering property can be obtained, and by varying the composition ratio between Ni and Au, the solder wettability can be controlled. Furthermore, the Ni-Au alloy film can be readily prepared by a vapor deposition method or a sputtering method and since the lamination step number (laminated layer number) does not increase, the electrode can be fabricated using the production facilities currently used.

Disclosure of Invention:

A surface treating structure for a solder joint according to the present invention is used for connecting a ground metal and an electrode, and comprises a solder layer interposed between the ground metal and the electrode; and an Ni-Au alloy layer which is interposed between the ground metal and the electrode and is formed on the solder layer and which contains 45 to 95 weight % (wt. %) (20 to 80 at. % (atomic %)) of Au.

(A): Also, a semiconductor electrode structure of the present invention comprises a contact layer composed of one of a rare earth metal film, a silicide film of the rare earth metal and a composite film of the rare earth metal and the silicide film which are formed on the semiconductor substrate; a diffusion preventing layer which is formed on the contact layer and is composed of a ferrous metal thin film; a solder joint layer which is composed of an Ni-Au alloy and is formed on the diffusion preventing layer; and a solder layer which is formed on the solder joint layer and is mainly composed of lead and tin.

Now, the semiconductor substrate is Si, Ge or the like and a contact layer is a rare earth metal such as Sc, Y, La, Ce, Er or the like, a silicide thereof or a composite of the former two materials as a main component and can include up to 7 weight % (20 at. %) of oxygen as an impurity.

Also, the contact layer is preferably one which mainly includes the rare earth metal, its silicide or the composite thereof and can include $Ca<1\%$, $Mg<1\%$, $Fe<1\%$, $Zn<0.01\%$, $Si<0.01\%$, $Al<0.01\%$ and $O<7\%$ in terms of weight % as impurities. Even when the impurities shown here are included in the semiconductor substrate or an electrode interface in concentration below the above-described values, since a chemical bonding of the rare earth metal or its silicide with the semiconductor substrate is strong enough, the impurities cannot raise the Schottky barrier height sufficiently so as to control the contact resistance.

Further, the film thickness so as to function as the contact layer is preferably at least 10 nm. If the film thickness is smaller than this value, the contact layer does not become uniform and the semiconductor and the diffusion preventing layer are partially and directly contacted with each other and the contact resistance becomes large. If the film thickness is larger than 1000 nm, the contact layer can peel off due to stress within the layer.

The diffusion preventing layer includes iron as a main component and its impurity contents in terms of weight % are desired to satisfy the conditions of $C<0.2\%$, $Si<0.5\%$, $Mn<1\%$, $P<0.03\%$, $S<0.03\%$, $Ni<3\%$, $Cr<2\%$ and $Mo<0.5\%$. If the impurities are included at levels greater than these values, the impurities can diffuse into the semiconductor or the sensor due to the heat in the soldering or the Joule heat generated by the current in the operation and the intrinsic characteristics of the electronic device may be degraded.

Also, when the film thickness satisfies the condition of 50 to 2000 nm, the diffusion preventing layer can perform the function sufficiently to prevent the tin or the like from diffusing. If the film thickness is less than 50 nm, the tin in the solder can diffuse into the semiconductor or the sensor part and if more than 2000 nm, the diffusion preventing layer can peel off due to the stress within the film.

The solder joint layer is the Ni-Au alloy and it is preferable to satisfy the condition of the Au concentration of 45 to 69 weight % (20 to 40 at. %). If the Au concentration is lower than 45 weight %, as in the case of the solder being directly jointed on to the Ni film, the solder wettability becomes very poor, and if more than 69 weight %, similar solder wettability to the case when the Au film is formed on the Fe film is exhibited, and thus good soldering cannot be executed. FIG. 1 shows a relationship between a composition ratio of the Ni-Au alloy formed on the Fe film of the diffusion preventing layer and a solder wettability (a spreading area of the solder). By using the Pb-Sn solder, the heating is carried out In a reducing atmosphere of $H_2/(H_2+N_2)=33$ at. % approximately 330 degree (C). In the Au concentration area of 45 to 95 weight % (20 to 80 at. %), preferably, 45 to 69 weight % (20 to 40 at. %), an excellent soldering property is shown in comparison with the Ni/Au laminated film of the prior art.

In addition, the film thickness of the Ni-Au alloy film necessarily satisfies the condition of 150 to 2000 nm and by this condition, the Ni-Au film can possess a sufficient solder wettability. If the film thickness is below 150 nm, the Ni-Au alloy quickly melts into the molten solder and the molten solder contacts the underlying Fe film to lower the soldering property. Although the underlying Fe film and the Ni-Au alloy are the metal-to-metal joint and thus have sufficient adhesion properties, if the film thickness is more than 2000 nm, the film can peel off due to the stress within the film. Further, owing to this stress, the semiconductor or the sensor part brings about unstable electrical properties and this is not preferable. FIG. 2 illustrates an Ni-Au alloy film thickness dependency of the spreading area of the solder. By using the Pb-Sn solder, the heating is carried out in the reducing atmosphere of $H_2/(H_2+N_2)=33\%$ at approximately 330 degree (C.). By using the film formation of more than 150 nm, the spreading area of the solder is improved compared with the Ni/Au laminated film of the prior art.

Further, the solder joint electrode structure of the present invention, for example, can be produced as follows. First, on the silicon substrate, the diffusion preventing layer and the solder joint layer are successively formed on the prepared contact electrode (the rare earth metal or its silicide). For example, when the film is formed by the sputtering method, the Fe film is produced by using a Fe target under the conditions of a sputtering gas Ar, a gas pressure of $3\times10^{-3}$ Torr, a substrate temperature of 300 degree (C.). Thereafter, within the same film forming apparatus, the Ni-Au alloy thin film is formed using an Ni-Au alloy target or Ni and Au targets under the same film forming conditions as the Fe film forming. Then, the silicon substrate is taken out of the film forming apparatus and is quickly connected to the mount base using the Pb-Sn solder to obtain the semiconductor electrode structure according to the present invention.

(B): Also, a no-flux soldering method of the present invention comprises heating two members via a solder foil interposed therebetween in a reducing atmosphere by using an Ni-Au alloy as a surface treated layer of at least one member.

At this time, if the composition of the Ni-Au alloy is varied in a range of 45 to 95 weight % (20 to 80 at. %), in comparison with the surface treatment of the Au/Ni laminated film of the prior art, the solder wettability becomes better and the wettability can be controlled. Hence, even when the member 41 having the sensor chip 44 including a built-in high integrated semiconductor circuit is placed on the upper side in the assembling direction so as not to contact with a jig, the solder wettability balance of the upper and lower joint surfaces 48 and 43 can be kept suitable and thus an excellent solder joint quality can be obtained.

Though there are many unclear parts of the mechanism of the soldering joint, with regard to the soldering joint of the Ni-Au alloy used in the present invention, the following function can be considered. The solderable materials are classified into three groups depending on the method of reacting with the molten solder as follows, such as 1) the materials (Au, Ag) to be molten into the solder, 2) the materials (Pb, Sn, Pb+Sn) to be molten at the solder joint temperature, and 3) the materials (Ni, Fe) which can be reacted with the solder but are difficult to melt. In the conventional Ni/Au or Ni/Ag laminated film structure, Au or Ag contacting the solder molten in the solder joint temperature range has a large melting speed into the solder, and with the melting of the solder, it melts into the solder. In this state, the ground metal of Au or Ag comes into direct contact with the solder, and the solder wettability and the soldering property exhibit the values dependent on the solder wettability of the ground metal Ni. Hence, the mechanism of the solder wettability of this two layer film is divided into two stages, such as the spreading of the solder by the melting of Au or Ag into the solder, and the spreading of the solder on the ground metal Ni.

In general, a contact angle θ (an angle produced by a solid surface and a liquid surface) showing the wettability of the liquid and solid surfaces is determined from a surface tension $\gamma_L$ of the liquid, a surface tension $\gamma_S$ of the solid and an interfacial tension $\gamma_{SL}$ between the liquid and solid so as to satisfy Young's equation as follows.

$$\gamma_{SL} - \gamma_s + \gamma_L \cos \theta = 0$$

In this case, the wettability improves as the value θ approaches 0. When the solder is molten, it is considered that the solder wettability on the metallic film is determined so as to satisfy this Young's equation. However, in the interface between the molten solder and the metallic film, a reaction product is formed. Accordingly, the interfacial tension is not constant. Further, after the soldering, with the coagulation of the solder during the cooling process, the surface tension of the solder is largely changed. In this manner, in the soldering process, a complicated phenomenon occurs, that is, the solder coagulates during the cooling process from the molten state, and in the interface between the solder and the metallic film, the reaction rapidly proceeds, and the state of the interface changes.

In the case of the Ni/Au laminated film, Au rapidly melts into the molten solder to contact with the underlying metal Ni. Since Au can become a solid solution in the solder, the molten solder spreads in the side ways direction, but since the wettability of the solder is inferior on the Ni film, its spreading is restricted.

On the other hand, the wettability mechanism of the solder with the Ni-Au alloy may be considered as follows. That is, Ni and Au do not form an intermetallic compound and are a binary system capable of carrying out a phase separation. It can be considered that the surface tension of the Ni-Au alloy becomes an intermediate value between the two values of the Ni and Au simple substances, but since the molten solder and the Ni-Au alloy can make solid solutions or form a compound, the wettability mechanism is not simple. However, in the film of the two layer structure such as Ni/Au, Au rapidly forms the solid solution in the solder and the solder and Ni contact with each other. In turn, in the case of the Ni-Au alloy, when Au in the alloy selectively forms the solid solution in the molten solder, since Au is uniformly contained in the whole alloy, the solder always contacts with the Ni-Au layer and it is considered that the solder can ensure good wettability compared with the Ni film. Further, Au in the Ni-Au alloy always forms the solid solution with the molten solder and thus the solder spreads stably. After the soldering step, in the coagulation step of the solder, too, the Au solid solution forming in the solder continues until the solder coagulating temperature and it is considered that the decrease of the spreading area does not occur during the coagulation. Also, by changing the Ni-Au alloy composition, the diffusion state in the solder is different and hence it is considered that the wettability can be controlled.

Moreover, because of the material properties of the Ni-Au alloy film, the solder wettability, the solder joint strength, the corrosion resistance and the thermal resistance are improved. The properties of the Ni metallic film are changed depending on the difference of the film forming methods. In order to improve the junction strength, the thermal resistance and the corrosion resistance, it is necessary to form an amorphous-like thin film having a high density and small crystal size in order to restrain the reaction with the tin, and the diffusion. However, in the current film forming method, when the Ni single film is formed, the film whose crystal is relatively grown is produced and from its grain boundaries the reaction or the diffusion proceeds. Hence, it is required to ensure the solder wettability of the Ni film and also to form the amorphous-like thin film having small crystal size.

For this purpose, a material whose atomic radius is different from that of Ni is employed, and when making an alloy from this material, the atoms are not aligned with regularity, and it can be considered to form an alloy which is made of a partial solid solution. As such a material, Au is given. When Au is used, in a case of Ni-Au (69 weight % or 40 at. %) alloy, such an irregular alloy results and a phase wherein one metal is partially deposited is formed. In this alloy, as shown in FIG. 3, it is readily understood from a relationship between a resistivity and an Au concentration, that in this concentration, the resistivity increases and a most irregular alloy is formed. Also, it is understood from an X-ray diffraction that, when Ni-Au alloy is used, the crystalline property is bad and the amorphous components become abundant, and that the crystals become small. Further, the microstructure of the alloy, the crystals do not grow in the heat treatment at below 400 degree (C.) and are thus stable. Hence at the solder joint temperature (350 to 400 degree (C.)), the film properties at the time of film forming do not change.

As described above, the Ni-Au alloy has the amorphous-like properties, and, since this alloy has the phase partially deposited, the adhesive strength of the interface between the solder and the Ni-Au alloy improves. Since the film forming generally is conducted under conditions shifted from the thermal equilibrium state, the properties of this alloy are clear to see. These characteristics include excellent adhesive strength compared with the conventional Ni/Au laminated film and this has been confirmed in a strength degradation test by a thermal cycle test. Further, concerning corrosion, the corrosion or the migration due to the impurities proceeds along the grain boundaries. Also, the moisture in the atmosphere is largely adsorbed on the surface and the grain boundaries of the metallic film. That is, since the Ni-Au alloy is the amorphous-like alloy with the random configuration, the resistance against corrosion is high. Also, since the alloy film has the phase partially deposited, the mechanical strength increases and the adhesive strength of the solder joint also improves.

Further, (A): in the semiconductor electrode structure of the present invention, this is classified into two functional structure groups as follows.

1) A laminated structure of a contact layer and a diffusion preventing layer. The contact layer has an electrically favourable ohmic property and is composed of a rare earth metal, its silicide or a composite thereof to keep a low contact resistance between the semiconductor and the metallic electrode.

2) A solder joint layer for keeping good solder wettability.

As the whole structure, in the middle of the three layer structure, a ferrous layer as a diffusion preventing layer is formed, and there is no mutual influence against the electrical properties and the soldering property of the two laminated layer structures, and the two structures become independent structures. In particular, the rate determination of the electrical properties is performed by current limitation due to the Schottky barrier of the interface between the semiconductor and the contact electrode, and the electric resistance of the solder joint layer and the solder part can be ignored.

First, the layers having the electrically favourable ohmic electrode function are the contact layer, which is formed on the semiconductor, and the semiconductor substrate, and is composed of the rare earth metal, its silicide or a composite thereof, and the diffusion preventing layer which is formed on the contact layer and composed of the ferrous metal. This ferrous metal has the function of preventing the tin in the solder from diffusing into the semiconductor substrate side and does not mutually diffuse with respect to the rare earth metal film or its silicide film with a combination of the rare earth metal film or its silicide film. That is, by virtue of the laminated structure of the combination of the rare earth metal film or its silicide film and the iron film, the semiconductor electrode structure of the present invention can keep the contact resistivity low and is excellent in thermal stability at the soldering temperature of 450 degree (C.).

As comparative examples, in a structure formed with the Ni film as the diffusion preventing layer, the reaction of Ni and the rare earth metal or its silicide proceeds during the heat treatment and the stability of the semiconductor and the contact layer is deteriorated.

Next, by forming the Ni-Au alloy film of the solder joint layer on the Fe film of the diffusion preventing layer, this has the function of ensuring the important solder wettability at the time of forming the solder joint of the semiconductor device onto the mount base. By forming the Ni-Au alloy solder joint layer on the Fe film, the solder wettability of the Fe film can be improved and excellent soldering can be made possible. In addition, the solder wettability can be ensured by the Ni-Au alloy, and the diffusion of the tin into the solder can be prevented by the Fe film of the diffusion preventing layer to improve the semiconductor joint strength.

(B): In the case of the pressure sensor, by using the Ni-Au alloy on the Ti layer or the like having bad solder wettability, the improvement of the solder wettability can be carried out in the same manner as described above.

Figure 1:
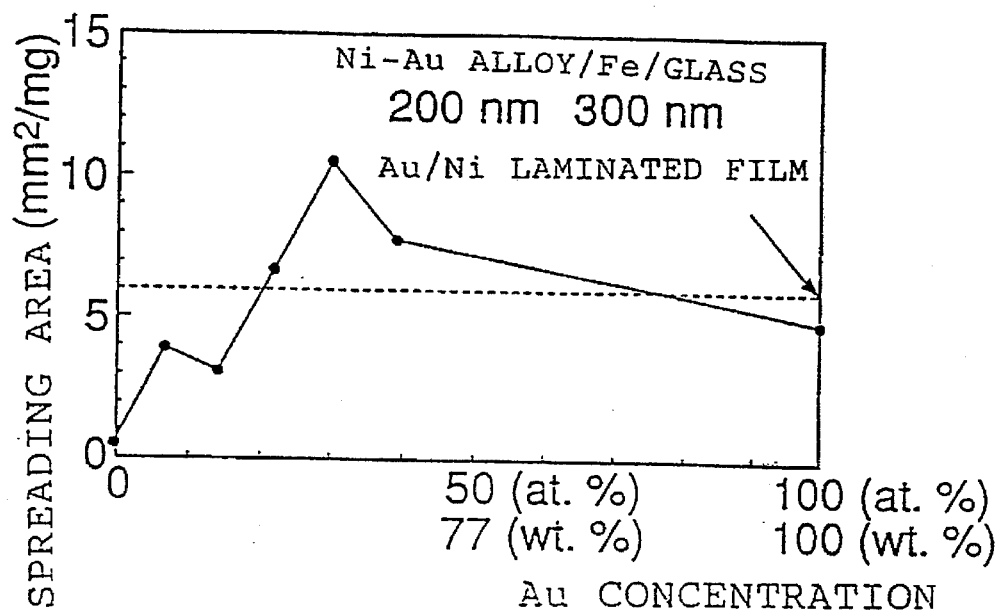
FIG. 1 is a diagram showing a relationship between a spreading area of a solder and an Ni-Au alloy composition ratio according to the present invention.
Figure 2:
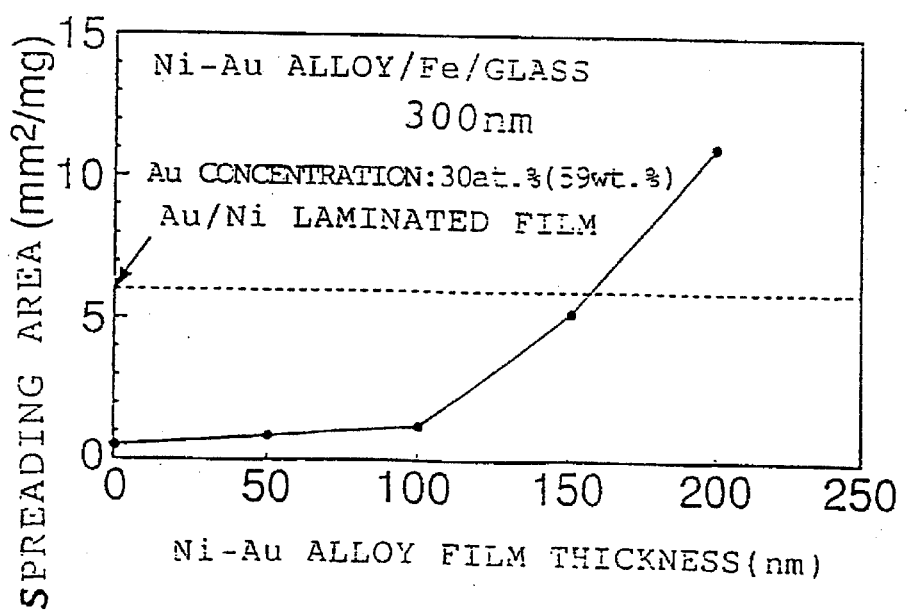
FIG. 2 is a diagram showing an Ni-Au alloy film thickness dependency of the spreading area of the solder according to the present invention.
Figure 3:
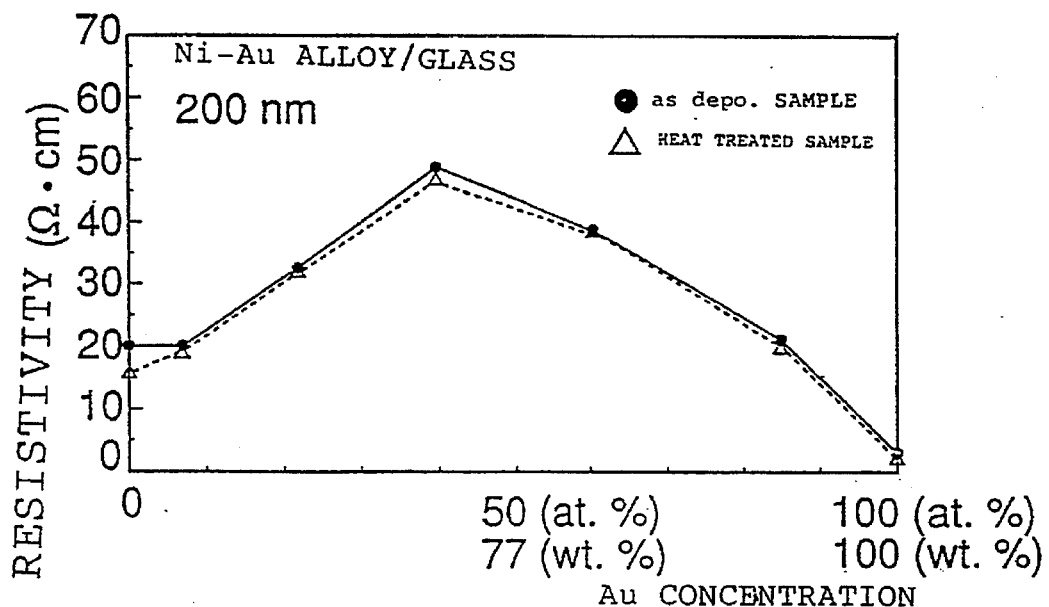
FIG. 3 is a diagram showing an Au concentration dependency of an Ni-Au alloy resistivity according to the present invention.

DESCRIPTION OF SYMBOLS:

10 semiconductor substrate
11 contact layer
12 diffusion preventing layer
13 solder joint layer
14 solder layer
15 mount base
41 glass pedestal
42 solder foil
43 stem
44 sensor chip
45 pressure inlet
46 pressure introduction path
47 joint with a glass and a diffusion preventing layer of Ni and Sn (Ti, Al/Ti or the like)
48 Ni-Au alloy layer Embodiments:

The present invention will now be described with reference to its embodiment in connection with the accompanying drawings.

Figure 4:
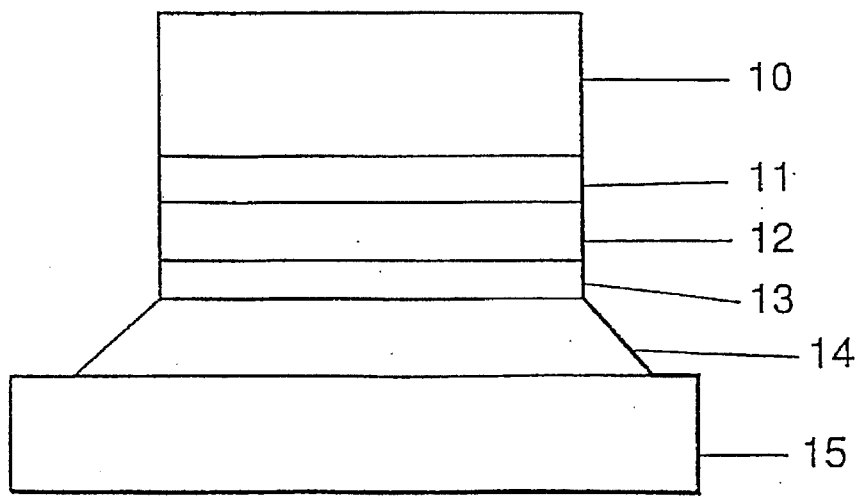
FIG. 4 is a cross section of one solder joint electrode structure of a first embodiment according to the present invention.

The first embodiment:

In FIG. 4, there is shown one solder joint electrode structure of the first embodiment according to the present invention. On a semiconductor substrate 10 composed of single crystalline silicon used for semiconductor devices, a contact layer 11 composed of a metallic film of Y (yttrium), Ce (cerium) or Eu (europium) for forming an ohmic electrode with the silicon, a diffusion preventing layer 12 composed of Fe, and a solder joint layer 13 composed of an Ni-Au alloy are consecutively formed, and the solder joint layer 13 of the semiconductor substrate 10 is connected to a mount base 15 through a Pb-Sn solder layer 14. The semiconductor substrate 10 is a P (phosphorus) doped n-type (100) wafer having a resistivity of 0.01 $\Omega \cdot cm$. The diffusion preventing layer 12 of Fe with a thickness of 300 nm and the solder joint layer 13 with a thickness of 200 nm are prepared. The Au content in the Ni-Au alloy of the solder joint layer 13 is 30 at. % (59 wt %).

A semiconductor electrode of the first embodiment of the present invention was prepared as follows: That is, first, the semiconductor substrate 10 was set in a sputter apparatus. After the sputter apparatus was evacuated to a vacuum degree of at most $3 \times 10^{-6}$ Torr, a Y thin film (the contact layer 11) was formed under the conditions of a sputter gas Ar (argon), a gas pressure $3 \times 10^{-3}$ Torr, and a substrate temperature 300 degree (C.) by an RF sputtering method and further an Fe thin film (the diffusion preventing layer 12) was formed using an Fe target within the same film forming apparatus. Further, an Ni-Au alloy thin film (the solder joint layer 13) was prepared using Ni and Au targets by simultaneous sputtering. Thereafter, the semiconductor substrate 10 was taken out of the film forming apparatus and the solder joint layer 13 was quickly soldered to the mount base 15 by the Pb-Sn solder layer 14 to obtain the solder joint electrode structure according to the present invention. In this embodiment, it was confirmed that the solder joint electrode structure of the present invention could also be produced using other vapor deposition methods among the many physical vapor deposition methods such as a vacuum vapor deposition method and an ion plating method, and a chemical vapor deposition method (CVD method) in addition to the sputtering method. Further, by an electroless plating, the solder joint layer could be formed simply and economically because a vacuum chamber was not used.

A contact resistivity of the produced semiconductor electrode structure was measured to obtain $1 \times 10^{-4}$ $\Omega \cdot cm^2$. Further, a heat resistance evaluation test of the semiconductor was carried out. In Table 1, heat treating temperatures and contact resistivity values after the heat resistance test at these temperatures are shown.

As is clear from Table 1, the solder joint electrode structure of the first embodiment has a low contact resistivity of $1.0 \times 10^{-4}$ $\Omega \cdot cm^2$ even in a heat treatment at 200° to 500° C. and possesses a stable ohmic property. In particular, in the heat treatment at below 450° C., the solder joint electrode structure has the contact resistivity of at most $2.0 \times 10^{-4}$. On the other hand, in this embodiment, even when the rare earth metal Eu or Ce as the contact layer 11 was used in place of Y, a similar contact resistivity to that using Y could be obtained and the same thermal stability could be obtained.

As comparative examples, the results of the thermal resistance evaluation test in the electrode structures in

TABLE 1

| Electrode structure | Heat resistance test (°C.) | Contact resistivity after test ($\Omega \cdot cm^2$) |
| --- | --- | --- |
| Examples | | |
| Si substrate/ | 200 | $1.0 \times 10^{-4}$ |
| Y/Fe/Ni—Au/ | 250 | $0.9 \times 10^{-4}$ |
| solder/mount | 300 | $0.9 \times 10^{-4}$ |
| base | 350 | $1.0 \times 10^{-4}$ |
| | 400 | $1.3 \times 10^{-4}$ |
| | 450 | $1.8 \times 10^{-4}$ |
| | 500 | $2.1 \times 10^{-4}$ |
| Si substrate/ | 200 | $0.8 \times 10^{-4}$ |
| Eu/Fe/Ni—Au/ | | |
| solder/mount | | |
| base | | |
| Si substrate/ | 200 | $1.3 \times 10^{-4}$ |
| Ce/Fe/Ni—Au/ | | |
| solder/mount | | |
| base | | |
| Comparative | | |
| Examples | | |
| Si substrate/ | 200 | $3.0 \times 10^{-3}$ |
| Y/Ni/Au/ | 300 | $8.0 \times 10^{-3}$ |
| solder/mount | 400 | $2.0 \times 10^{-2}$ |
| base. | | | which Ni was used in place of Fe are also shown in Table 1. As shown in Table 1, in the comparative examples, the contact resistivity values are increased by at least a factor of ten, and the ohmic property is degraded, and hence the electrode structures cannot be used for the electrode.

Figure 5:
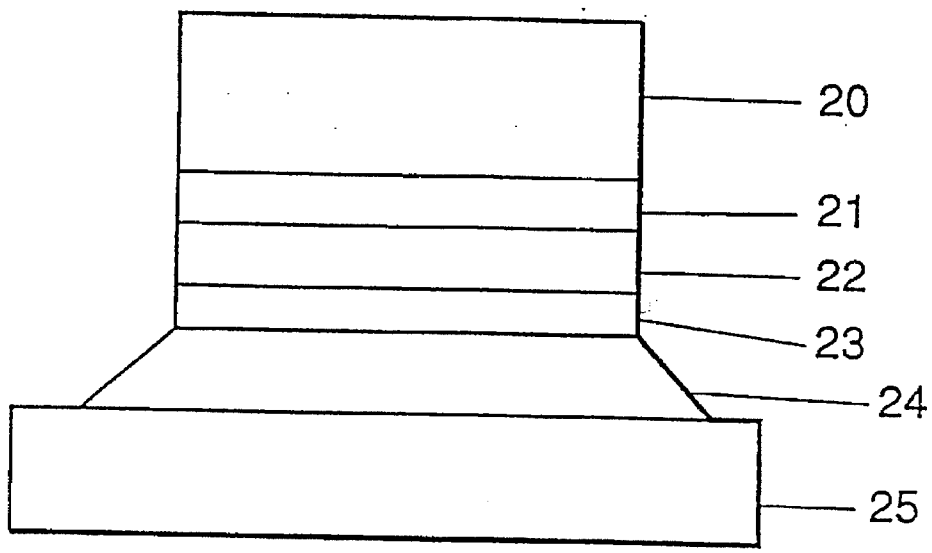
FIG. 5 is a cross section of another solder joint electrode structure of a second embodiment according to the present invention.

The second embodiment:

FIG. 5 illustrates another solder joint electrode structure of the second embodiment according to the present invention. On a semiconductor substrate 20 composed of the single crystalline silicon, a contact layer 21 composed of yttrium silicide, a diffusion preventing layer 22 composed of an iron alloy film, and a solder joint layer 23 of an Ni-Au layer are successively formed, and the solder joint layer 23 of the semiconductor substrate 20 is connected to a mount base 25 through a Pb-Sn solder layer 24. In order to obtain the solder joint electrode structure of the second embodiment, the contact layer (an yttrium silicide layer or an erbium (Er) silicide layer) 21, the diffusion preventing layer (the iron alloy film) 22, and the Ni-Au solder joint layer 23 were consecutively formed on the semiconductor substrate 20 under the same conditions as those of the first embodiment using the same sputter apparatus as that used in the first embodiment. Thereafter, the semiconductor substrate 20 having an electrode made up of the three layers was taken out of the film forming apparatus and was left in the atmosphere for one week.

In the second embodiment, as the contact electrode, the rare earth metal silicide (the yttrium silicide or the erbium silicide) which is more stable than the rare earth metals in the atmosphere is formed on the semiconductor substrate 20. As the solder joint layer 23, the Ni-Au alloy having a high stability in the atmosphere is used. Hence, this solder joint layer 23 functions as a protecting film for preventing oxidization and further the oxidization speed of the yttrium in the atmosphere becomes slower than the metallic yttrium due to the siliciding. Accordingly, in this embodiment, different from the first embodiment, it is not necessary to quickly solder the semiconductor substrate 20 to the mount base 25 by the Pb-Sn solder layer 24. Hence, in this case, after the semiconductor substrate 20 provided with the three layers 21, 22 and 23 was left in the atmosphere for one week, the solder joint layer 23 of the semiconductor substrate 20 was connected to the mount base 25 through the Pb-Sn solder layer 24 to obtain the solder joint electrode structure of the second embodiment.

In the same manner as the first embodiment, the contact resistivity of the electrode structure was measured. The measuring of the contact resistivity was carried out at room temperature and at −30 degree (C.). Further, the heat resistance evaluation test was performed. The results are shown in Table 2.

As will be apparent from Table 2, the solder joint electrode structures of the second embodiment have a low contact resistivity of $0.8 \times 10^{-4}$ to $3.2 \times 10^{-4}$ $\Omega \cdot cm^2$ at room

TABLE 2

| Electrode structure | Heat resist- ance test (°C.) | Contact resistivity after test ($\Omega \cdot cm^2$) | |
|---|---|---|---|
| | | Room temp. | −30 degree(C.) |
| Examples | | | |
| Si substrate/ | 200 | $1.0 \times 10^{-4}$ | $1.1 \times 10^{-4}$ |
| Y siliside/Fe | 250 | $0.9 \times 10^{-4}$ | $1.0 \times 10^{-4}$ |
| alloy/Ni—Au/ | 300 | $0.9 \times 10^{-4}$ | $0.9 \times 10^{-4}$ |
| solder/mount | 350 | $1.0 \times 10^{-4}$ | $1.1 \times 10^{-4}$ |
| base | 400 | $1.3 \times 10^{-4}$ | $1.3 \times 10^{-4}$ |
| | 450 | $1.8 \times 10^{-4}$ | $1.8 \times 10^{-4}$ |
| | 500 | $3.2 \times 10^{-4}$ | $3.5 \times 10^{-4}$ |
| Si substrate/ | 200 | $0.8 \times 10^{-4}$ | $1.0 \times 10^{-4}$ |
| Er siliside/Fe | 300 | $0.9 \times 10^{-4}$ | $1.2 \times 10^{-4}$ |
| alloy/Ni—Au/ | 400 | $1.4 \times 10^{-4}$ | $1.4 \times 10^{-4}$ |
| solder/mount base | 500 | $2.0 \times 10^{-4}$ | $2.1 \times 10^{-4}$ |
| Compara- tive Examples | | | |
| Si substrate/ | 200 | $1.0 \times 10^{-3}$ | $7.2 \times 10^{-3}$ |
| Cr/Ni/Au/ | 300 | $1.5 \times 10^{-3}$ | $9.2 \times 10^{-3}$ |
| solder/mount base | 400 | $2.0 \times 10^{-3}$ | $9.6 \times 10^{-3}$ | temperature after the heat treatment at 200 to 500 degree (C.) and exhibit stable ohmic properties. In particular. In the heat treatment at below 450 degree (C.), the contact resistivity of at most $2 \times 10^{-4}$ $\Omega \cdot cm^2$ could be obtained. Further, at the low temperature of −30 degree (C.), the increase of the contact resistivity can hardly be observed compared with that at room temperature and it is readily understood that an ideal ohmic electrode was produced. Moreover, it is understood that the solder joint electrode structure is most suitable as the electrode for electronic components used in cold environments.

Also, in Table 2, as comparative examples, the results of the contact resistivity and the heat resistance of the electrode structures in which Cr/Ni/Au layers of the prior art are formed on the semiconductor substrate 20 are shown. As shown in Table 2, in the comparative examples, the contact resistivity is a factor of ten higher than that of the present examples and it is difficult to obtain the ohmic electrode with respect to the semiconductor substrate having the high resistivity. Further, at the low temperature of −30 degree (C.), exhibits in the electrical properties of the semiconductor and the electrode begin to display rectification properties, and it is clear that the conventional structures cannot be applied to the electronic components in the cold environments.

Figure 6:
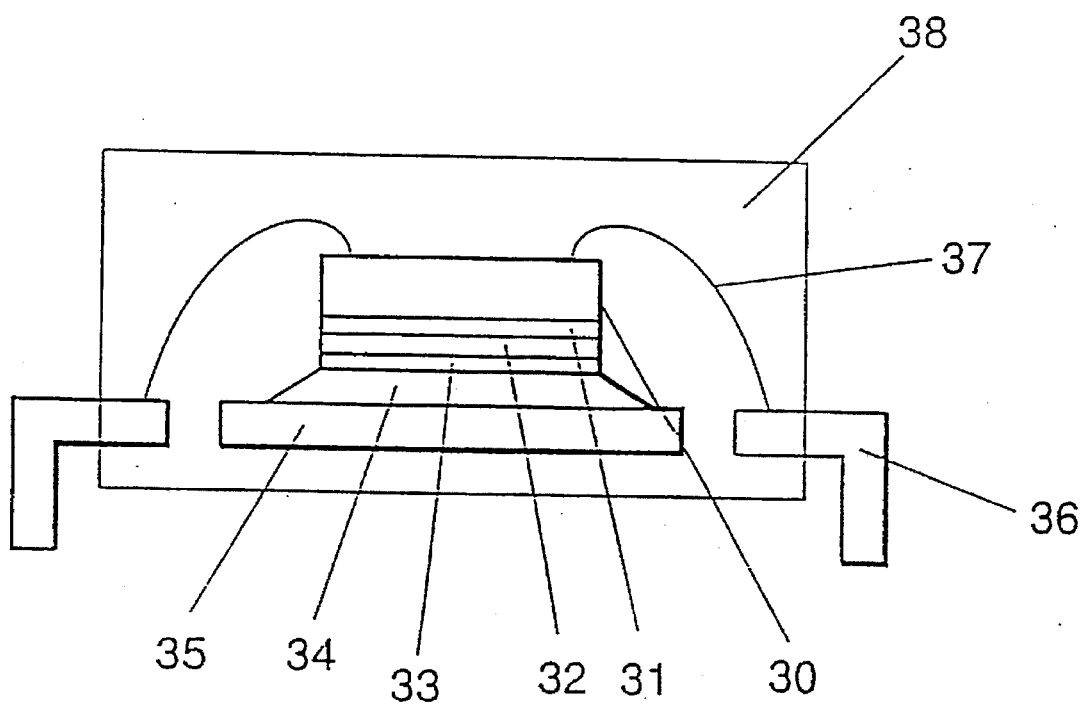
FIG. 6 is a cross section of a further solder joint electrode structure of a third embodiment according to the present invention.

The third embodiment:

FIG. 6 shows a further solder joint electrode structure of the third embodiment according to the present invention. On a semiconductor substrate 30 composed of the single crystalline silicon, a contact layer 31 of Y, a diffusion preventing layer 32 composed of an Fe film, and a solder joint layer 33 of an Ni-Au layer are successively formed, and the solder joint layer 33 of the semiconductor substrate 30 is connected to a mount base 35 through a Pb-Sn solder layer 34. In this embodiment, an upper electrode of a semiconductor device and a lead frame 36 are coupled with each other by a metallic lead wire 37 and further the whole semiconductor device is sealed by a resin 38 to obtain a semiconductor device package product.

In order to obtain the solder joint electrode structure of the third embodiment, after an evacuation to $10^{-7}$ Torr was carried out by utilizing an electron beam vapor deposition apparatus, the contact layer (the yttrium layer) 31, the diffusion preventing layer (the iron film) 32 and the Ni-Au solder joint layer 33, using Ni-Au alloy pellets, were consecutively formed on the semiconductor substrate 30 using a triple electron beam gun. Thereafter, the semiconductor substrate 30 provided with an electrode made up of the three layers was taken out of the vapor deposition apparatus. After the semiconductor substrate 30 was cut into chips by dicing, the solder joint layer 33 of the cut chip was quickly soldered to the mount base 35 by the Pb-Sn solder layer 34 and the upper electrode of the device was coupled with the lead frame 36 by the metallic lead wire 37. Then, the whole device was sealed using the resin 38 such as an epoxy resin to obtain the semiconductor device package.

In the third embodiment, the solder wettability for mounting the semiconductor device and the moisture resistance and the thermal shock resistance after the mounting were confirmed. In this case, as the solder, a high temperature solder containing mainly lead and approximately 10 weight % of tin was used. A spreading area per unit mass of solder was measured to evaluate the solder wettability. Also, a humidity test was carried out at a temperature of 65 degree (C.) for one month under a humidity of 95%, and a change of an on-resistance of a power transistor formed on the device before and after the humidity test was tested, and the moisture resistance of the solder joint part was examined. Further, the mount base part of the device package sealed by the resin was rapidly heated to 400 degree (C.) using a laser and the state of the solder joint part was observed to evaluate the thermal shock resistance.

These results are shown in Table 3. In this embodiment, the iron film was formed for the diffusion preventing layer and the Ni-Au alloy film was formed for the solder joint layer. Hence, the solder wettability was better, and the moisture resistance at the solder joint part was excellent, and the on-resistance change before and after the humidity test was very small. Further, after the impact, the solder joint part was firmly connected and no crack was caused.

TABLE 3

Spreading area of high temperature solder, humidity reliability test and thermal shock resistance.

| Electrode structure | Spreading area of solder (mm²/mg) | Humidity test (on resistance change) | Thermal shock test |
|---|---|---|---|
| Examples | | | |
| Y/Fe/Ni-8at.%Au | 3.9 | <0.5% | no change |
| Y/Fe/Ni-25at.%Au | 6.7 | <0.5% | no change |
| Y/Fe/Ni-35at.%Au | 10.2 | <0.5% | no change |
| Y/Fe/Ni-50at.%Au | 7.9 | <0.5% | no change |
| Ti/Fe/Ni-30at.%Au | 10.8 | <0.5% | no change |
| Cr/Fe/Ni-30at.%Au | 10.6 | <0.5% | no change |
| Comparative Examples | | | |
| Y/Fe/Au(50nm) | 2.9 | — | — |
| Cr/Ni/Ni-30at.%Au | 9.8 | 20% | crack |
| Ti/Ni/Au(50nm) | 5.9 | 25% | crack |

Contrary to this, as shown in the comparative examples, in the electrode structure wherein the iron film was formed for the diffusion preventing layer and an Au film having a thickness of 50 nm as the solder joint layer was formed on the diffusion preventing layer, the solder wettability was bad and the semiconductor substrate with an electrode of the three layers cannot be soldered to the mount base. Further, by using conventional Ti/Ni/Au layers or Cr/Ni/Ni-Au layers, the solder wettability was ensured, but the tin within the solder diffused, and cracks were caused in the solder joint part in the heat shock resistance test. Also, corrosion could be observed in the solder joint part, and the electric resistance at the solder joint part become large, and the on-resistance increase in the transistor could be observed.

Figure 7:
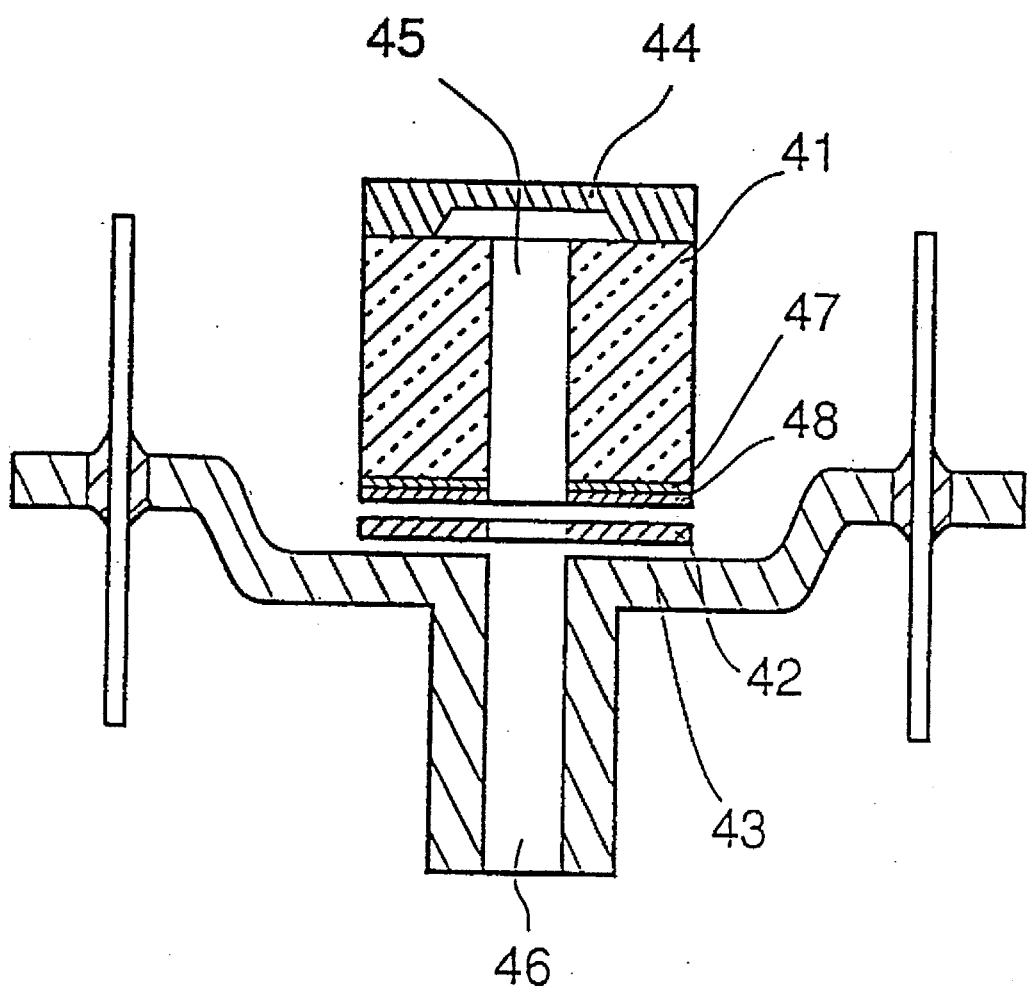
FIG. 7 is a cross section showing a construction of a case applied to a pressure sensor unit of a fourth embodiment according to the present invention.

The fourth embodiment:

A fabrication of a pressure sensor whose joint part size is very small and that requires a high airtightness at a junction part will be described and FIG. 7 shows the construction of the pressure sensor to be soldered to a stem.

The pressure sensor is assembled by connecting parts of a sensor chip 44 composed of a semiconductor and the like and a glass pedestal 41 to which the sensor chip 44 is mounted, to a metallic stem 43 composed of, for example, 42-alloy (Fe: 58% and Ni: 42%) or the like. In this case, the stem 43 is provided with a pressure introduction path 46 in its central axial part and the glass pedestal 41 is formed with a pressure inlet 45 leading to the sensor chip 44 in its central axial part. The glass pedestal 41 and the stem 43 are coupled so that the pressure inlet 45 and the pressure introduction path 46 may be coaxially arranged. And in such a construction, a pressure to be measured of the air introduced into the pressure introduction path 46 acts on a diaphragm surface of the sensor chip 44 and a generated signal is processed in a semiconductor circuit integrated in the sensor chip 44, and is detected.

In this embodiment, the joint surface of the stem 43 is successively applied with an Ni plating and an Ni-B plating, and the glass pedestal 41 composed of a Pyrex glass (trade name: Corning Inc.) is consecutively formed with a Ti film or an Al/Ti laminated film 47 and an Ni-Au alloy film 48 on its joint surface by a sputtering method or the like.

In this embodiment, when the stem 43 and the glass pedestal 41 are jointed, a solder foil 42 having a thickness of approximately 45 to 50 μm is placed on the joint area of the stem 43 and the glass pedestal 41 is put on the solder foil 42. Then, a soldering connection of the glass pedestal 41 and the stem 43 is performed, for example, in a reducing gas atmosphere of $H_2/(H_2+N_2)$=at least 30% by heating at 250 to 320 degree (C.).

Further, in this embodiment, the Ni-Au alloy film 48 formed on the joint surface of the glass pedestal 41 contains 30 at. % (59 wt. %) of Au and has a thickness of 200 nm.

That is, in this embodiment, by improving the solder wettability of the glass pedestal surface by the Ni-Au alloy film without using a solder spreading effect due to a load of the stem or another weight, even when the glass pedestal 41 is arranged on the upper side, the solder wettability balance between the glass pedestal 41 and the joint surface of the stem 43 can be improved and fine soldering can be carried out. Further, even when the surface plating on the stem side is formed by an inexpensive Ni-B plating, although the solder wettability is slower than Au, excellent soldering can be performed due to the improvement of the wettability caused by the solder's own weight and the improvement of the solder wettability balance of the joint surface. Hence, a no-flux soldering method which permits the pressure sensor to be built with high airtightness and high strength without making any flaw on the surface of the sensor chip 44 including a high integrated semiconductor circuit, can be realized.

Like the aforementioned embodiment, in the case where a surface area of a lower member placed on the lower side in the assembling is larger and its solder wettability is somewhat smaller (Ni-B/Ni plating), it is desirable to improve the solder wettability on the joint surface of an upper member having a smaller area. However, in the case where the area of the lower member is larger and the solder wettability is good (for example, Au plating), in order to prevent a solder defect due to an excess flow of the solder, it is preferable to provide means for restricting the solder flow on the lower member to only the joint part with the upper member (for example, a dam, a groove or a partial plating for stopping the solder flow-away).

Moreover, in this embodiment, although the Ni-Au alloy has been used on only the joint surface of the upper member, the Ni-Au alloy can be used on the joint surface of the lower member and what is necessary is to permit the solder wettability balance between both the joint surfaces of the upper and lower members to keep to a proper state.

Furthermore, the Ni-Au alloy of the present invention can be suitably used for obtaining the good solder wettability in other equipments in addition to the pressure sensor.

Further, in the no-flux soldering, particularly, since the preventing of the oxidization of the outermost surface of the joint part is most important, the outermost surface is formed with the Ni-Au alloy layer and a laminated structure of Ni/Ni-Au alloy can be used as required.

Effects of Invention:

As described above, in the case where a surface treatment for a solder joint by an Ni-Au alloy according to the present invention, for example, is applied to a semiconductor electrode structure, by forming a rare earth metal or its silicide film as a contact layer, a ferrous metal as a diffusion preventing layer, and the Ni-Au alloy as a solder joint layer, an excellent ohmic property is exhibited up to a high temperature required for a solder joint at approximately 450 degree (C.) to hold a low contact resistance and while a diffusion of tin within a solder is prevented, a solder joint electrode structure which can be readily soldered and has a large joint strength can be produced.

Further, a no-flux soldering method using the Ni-Au alloy according to the present invention can be effectively applied to soldering of the case which has a fine joint surface and where a high airtightness and a high strength joint are required and, for example, is effectively applicable to the case where a pressure sensor is assembled.

Further, by making the soldering in a no-flux method, a cleaning step for removing flux residue after the soldering can be omitted, and an automatic assembling can be readily realized, and environmental protection such as being free from Freon can be effectively attainable.

We claim:

1. A solder joint for connecting a ground metal to an electrode, comprising:

a solder layer interposed between said ground metal and said electrode; and a layer of a Ni-Au alloy interposed between said solder layer and at least one of said ground metal and said electrode; said Ni-Au alloy containing 45 to 95 weight % of Au and contacting directly said solder layer.

2. The solder joint according to claim 1, wherein said Ni-Au alloy comprises:

45 to 95 weight % of Au;

55 to 5 weight % of Ni; and a small amount of impurity which is difficult to remove.

3. The solder joint according to claim 2, wherein said electrode comprises:

a contact layer composed of one of:
      a rare earth metal film,
      a silicide film of said rare earth metal, and
      a composite film of said rare earth metal film and said silicide film.

4. The solder joint according to claim 3, wherein said electrode further comprises:

a diffusion preventing layer composed of a ferrous metal thin film formed on said contact layer; and said Ni-Au alloy layer being formed on said diffusion preventing layer.

5. A solder joint according to claim 1, wherein:

said solder joint is substantially flux-free.

6. A semiconductor electrode structure for connecting a semiconductor substrate to a mount base using solder, comprising:

a contact layer on said semiconductor substrate comprising one of:
      a rare earth metal film,
      a silicide film of said rare earth metal, and
      a composite film of said rare earth metal and said silicide film;

a diffusion preventing layer comprising a ferrous metal thin film formed on said contact layer; and a Ni-Au alloy solder joint layer formed on said diffusion preventing layer.

7. The semiconductor electrode structure according to claim 6, wherein:

said Ni-Au alloy contains 45 to 95 weight % of Au.

8. The semiconductor electrode structure according to claim 7, wherein:

said contact layer includes at most 7 weight % of oxygen as an impurity.

9. The semiconductor electrode structure according to claim 8, wherein said contact layer further comprises:

impurities in terms of weight % as follows:
   Ca<1%,
   Mg<1%,
   Fe<1%,
   Zn<0.01%,
   Si<0.01%, and
   Al<0.01%.

10. The semiconductor electrode structure according to claim 9, wherein:

said contact layer has a film thickness of 10 to 1000 nm.

11. The semiconductor electrode structure according to claim 7, wherein said diffusion preventing layer further comprises impurities in terms of weight % as follows:
   C<0.2%,
   Si<0.5%,
   Mn<1%,
   P<0.03%,
   S<0.03%,
   Ni<3%,
   Cr<2%, and
   Mo<0.5%.

12. The semiconductor electrode structure according to claim 11, wherein:

said diffusion preventing layer has a film thickness of 50 to 2000 nm.

13. The semiconductor electrode structure according to claim 7, wherein said Ni-Au alloy solder joint layer comprises:

45 to 95 weight % of Au.

14. The semiconductor electrode structure according to claim 13, wherein:

said Ni-Au alloy solder joint layer has a film thickness of 150 to 2000 nm.

15. A solder joint for connecting a first element and a second element, comprising:

a solder layer interposed between said first element and said second element; and a layer of a Ni-Au alloy interposed between said solder layer and at least one of said first element and said second element, said Ni-Au alloy containing 45–95 weight % of Au and contacting directly said solder layer.

16. The solder joint according to claim 15, wherein:

said first element is a ground metal; and said second element is an electrode.

17. A solder joint according to claim 15, wherein:

said solder joint is substantially flux-free.

18. An electrode having an electrical contact adapted to provide a substantially flux-free solder connection, said electrical contact comprising:

a layer of a Ni-Au alloy containing 45 to 95 weight % of Au.

19. A solder joint for connecting a ground metal to an electrode of a semiconductor device, said solder joint comprising:

a solder layer interposed between said ground metal and said electrode; and a layer of a Ni-Au alloy between said solder layer and at least one of said ground metal and said electrode, said Ni-Au alloy containing 45 to 95 weight % of Au.

* * * * *